(12) United States Patent
Salz et al.

(10) Patent No.: US 11,702,735 B2
(45) Date of Patent: *Jul. 18, 2023

(54) USE OF A CARBONACEOUS COATING FOR PROTECTING A PASSIVE ELECTRIC COMPONENT FROM ATTACK BY AMMONIA AND SYSTEM COMPRISING A PASSIVE ELECTRICAL COMPONENT, WHICH IS PROTECTED AGAINST ATTACK BY AMMONIA

(71) Applicant: Fraunhofer-Gesellschaft zur Förderung der angewandten Forschung e.V., Munich (DE)

(72) Inventors: Dirk Salz, Bremen (DE); Andreas Stake, Bremen (DE); Malte Burchardt, Bremen (DE); Franz-Josef Wöstmann, Munster (DE); Stefan Dieckhoff, Lilienthal (DE); Christoph Regula, Bremen (DE); Christopher Dölle, Delmenhorst (DE); Ralph Wilken, Rastede (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/758,329

(22) PCT Filed: Oct. 23, 2018

(86) PCT No.: PCT/EP2018/079046
§ 371 (c)(1),
(2) Date: Jun. 10, 2020

(87) PCT Pub. No.: WO2019/081514
PCT Pub. Date: May 2, 2019

(65) Prior Publication Data
US 2020/0340105 A1  Oct. 29, 2020

(30) Foreign Application Priority Data

Oct. 23, 2017 (DE) .......................... 102017124692.4
Feb. 2, 2018 (DE) .......................... 102018102416.9

(51) Int. Cl.
*C23C 16/26* (2006.01)
*C23C 28/04* (2006.01)
(Continued)

(52) U.S. Cl.
CPC .............. *C23C 16/26* (2013.01); *C23C 16/00* (2013.01); *C23C 16/0272* (2013.01);
(Continued)

(58) Field of Classification Search
CPC ..... C23C 16/26; C23C 16/00; C23C 16/0272; C23C 16/22; C23C 28/00; C23C 28/046;
(Continued)

(56) References Cited

U.S. PATENT DOCUMENTS

2004/0069466 A1* 4/2004 Blangetti ................ F28F 13/18
165/133
2012/0003483 A1 1/2012 Salz et al.
(Continued)

FOREIGN PATENT DOCUMENTS

CN        1675058 A      9/2005
CN      104105594 A     10/2014
(Continued)

OTHER PUBLICATIONS

Oil-Impregnated Nanoporous Oxide Layer for Corrosion Protection with Self-Healing (Year: 2017).*
(Continued)

*Primary Examiner* — Michael B Nelson
(74) *Attorney, Agent, or Firm* — Preti Flaherty Beliveau & Pachios LLP

(57) ABSTRACT

The invention relates to the use of a carbonaceous coating for protection of a passive electrical component from attack
(Continued)

by ammonia, wherein the carbonaceous coating is a sol-gel coating or a plasma-polymeric coating. This coating comprises a particular carbon content.

34 Claims, 1 Drawing Sheet

(51) Int. Cl.
  *C23C 28/00* (2006.01)
  *C23C 16/00* (2006.01)
  *C23C 16/02* (2006.01)
  *C23C 16/22* (2006.01)

(52) U.S. Cl.
  CPC .............. *C23C 16/22* (2013.01); *C23C 28/00* (2013.01); *C23C 28/046* (2013.01); *Y10T 428/31663* (2015.04)

(58) Field of Classification Search
  CPC ... C23C 28/04; C23C 16/505; B05D 2350/63; B05D 1/62; H01F 5/06; H01F 41/12; F25B 9/002; F28F 19/02
  See application file for complete search history.

(56) References Cited

U.S. PATENT DOCUMENTS

| | | | |
|---|---|---|---|
| 2016/0049609 A1* | 2/2016 | Ezure | C23C 16/325 427/547 |
| 2016/0201191 A1 | 7/2016 | Bucher et al. | |
| 2019/0206608 A1 | 7/2019 | Salz et al. | |

FOREIGN PATENT DOCUMENTS

| | | |
|---|---|---|
| CN | 104332564 A | 2/2015 |
| CN | 104753221 B | 7/2015 |
| DE | 19608158 C1 | 8/1997 |
| DE | 10131156 A1 | 1/2003 |
| DE | 102004049111 A1 | 4/2006 |
| DE | 10 2011 005 234 A1 | 9/2012 |
| DE | 10 2013 110 394 B4 | 3/2015 |
| DE | 10 2014 224 798 A1 | 6/2016 |
| DE | 102016214493 A1 | 2/2018 |
| EP | 1260606 A2 | 11/2002 |

OTHER PUBLICATIONS

Ferreira, C. et al., "Wet Compression of Pure Refrigerants," International Compressor Engineering Conference, paper, Jul. 17-20, 2006.

International Search Report, dated Mar. 4, 2019, for related International Application No. PCT/EP2018/079046. German with English translation.

Lommatzsch, U. et al., "Plasma Polymerization of HMDSO with an Atmospheric Pressure Plasma Jet for CorrosionProtection of Aluminum and Low-Adhesion Surfaces," Plasma Processes and Polymers, vol. 6, pp. 642-648, copyright 2009 WiLEY-VCH Verlag GmbH & Co. KGaA, Weinhelm.

German Examination Report, dated Apr. 13, 2017, from priority DE 10 2016 214 493.6, filed Aug. 4, 2016.

International Search Report and Written Opinion, dated Oct. 5, 2017, from counterpart PCT/EP2017/069782, filed Aug. 4, 2017.

* cited by examiner

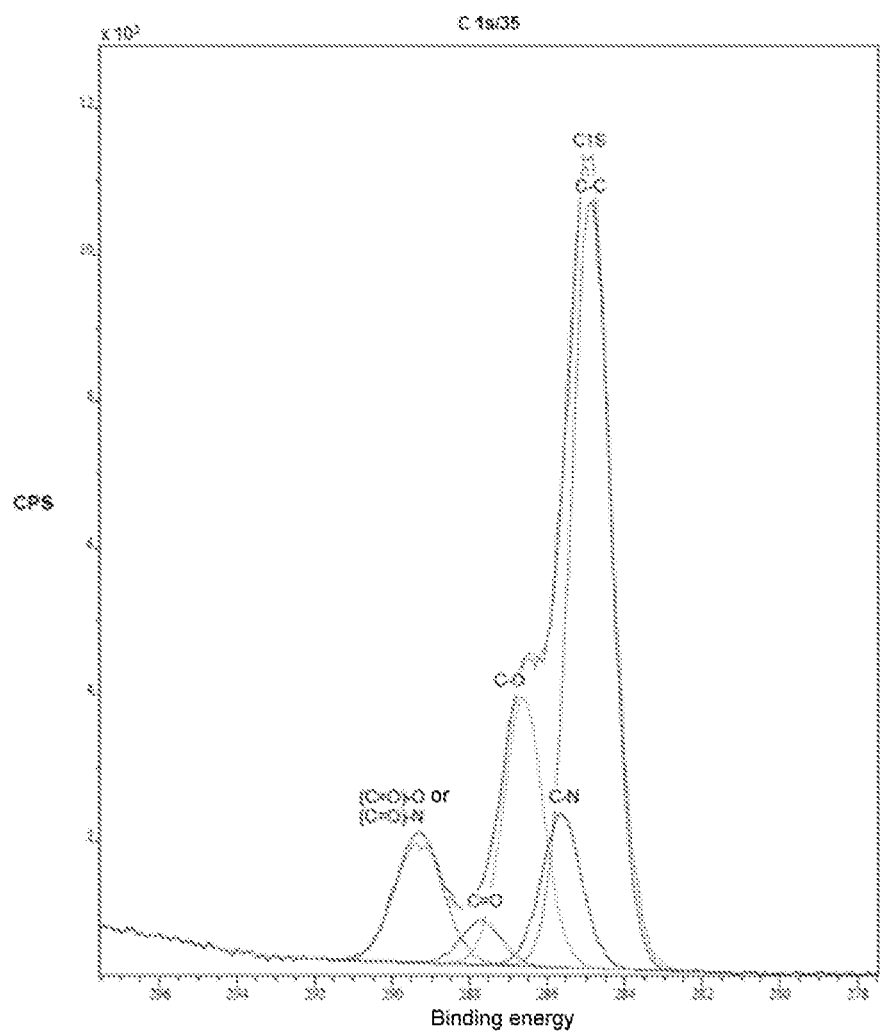

USE OF A CARBONACEOUS COATING FOR PROTECTING A PASSIVE ELECTRIC COMPONENT FROM ATTACK BY AMMONIA AND SYSTEM COMPRISING A PASSIVE ELECTRICAL COMPONENT, WHICH IS PROTECTED AGAINST ATTACK BY AMMONIA

The invention relates to the use of a carbonaceous coating for protection of a passive electrical component from attack by ammonia, wherein the carbonaceous coating is a sol-gel coating or a plasma-polymeric coating. This coating comprises a particular carbon content.

The invention further relates to a system intended for contact with ammonia or ammoniacal media, comprising a passive electrical component having a carbonaceous coating intended for the use of the invention.

STATE OF THE ART

Cooling, for example in chest freezers, refrigerated warehouses or refrigerated containers, is accomplished by using cooling aggregates operated with synthetic coolants. With regard to new environmental regulations and EU Directives, many of the agents currently being used (e.g. R134a, R404A, R407C and R410A) in their current composition, as a result of the global warming potential (CO2 equivalent) ascribed to them, will no longer be usable in the future (from 2030). These substances are to be replaced by alternative climate-neutral or natural coolants, for example CO2, propane, butane or else ammonia (NH3) (see also "Die neue F-Gase-Verordnung—Ziele, Inhalte, Konsequenzen" [The New F Gases Directive—Aims, Measures, Consequences], BTGA-Almanach 2015, pages 92-94).

In general, the coolants, in combination with the typical temperature profiles in cooling systems (e.g. repeated cooling and thawing every day with temperature variations from −40° C. to +80° C.), can lead to high thermal and chemical material stress. Especially in the case of ammonia, an important factor here is adequate chemical stability of the insulation materials and all other materials that are in contact with this substance. Only very few polymers offer the required stability here (PA, POM, PE, PP, PETP or else PTFE, which are additionally each limited to different temperature ranges). Furthermore, these polymers are available only to a limited degree with regard to the corresponding material costs and the associated usability in the form of thin electrically insulating layers.

If the coolant is also to be used directly in the cooling aggregate for cooling, in order to reduce the energy expenditure by dispensing with a heat exchanger, an especially important factor in the electric motor/compressor is a chemically resistant and thermally stable electrical insulation capacity of the components used therein. For such applications, it is often not possible to use components made of copper (for example in the electric motors (coils) of the compressors) since they are significantly attacked by ammonia. Corresponding components made of aluminum could be an alternative here to the copper materials customary to date owing to their greater chemical stability to ammonia.

In addition, ammonia is widely used in the pharmaceutical industry, fertilizer industry, explosives industry and steel industry, chemical industry, paper and plastics industry, in the cleaning industry and in flue gas cleaning, and in all sectors involving use or production of aqueous ammonia. In all sectors of industry mentioned, the same problems as outlined above with regard to the use of copper and non-ferrous metals are generally applicable in the case of contact with ammonia.

In existing cooling systems, either synthetic coolants are still being used in most cases, or separate cooling circuits are being used (primary and secondary cooling circuit with separation of compressor and cooling side). As well as the risk of endangerment by the existing coolants, there is also the risk here of system failure in the event of leaks between the two cooling circuits. In the case of the alternative ammonia coolant in the cooling circuit, in the event of such a leak, the electrical insulations of the electric motors/compressor drives installed in the compressor circuit would be attacked and possibly destroyed. This would lead to failure of the system and necessitate inconvenient and costly disassembly or replacement of the coils or even of the entire electric motor/compressor.

Therefore, in the case of the alternative ammonia coolant, freedom from copper currently has to be assured in the materials installed in the cooling circuit since ammonia attacks copper-containing materials to an enhanced degree.

Furthermore, separate cooling circuits have the potential for losses known for heat exchangers in respect of cooling of the drive with the refrigeration from the secondary circuit. Analogously, the same problems are applicable to all further areas mentioned in the text above in which ammonia or ammonia-containing solutions/compounds are employed, e.g. aqueous ammonia.

Against the background of the prior art and also the changing legal provisions, It was an object of the present invention to specify an improved solution for the protection of components against ammonia or ammoniacal media. It was desirable here that the components are not just protected against liquid ammonia or liquid ammoniacal media, but that there is also very good protection against gaseous ammonia.

In addition, the good protection characteristics should preferably also exist over a very wide temperature range. It should be taken into account here that many materials have different behavior with respect to liquid ammonia or liquid ammoniacal media and gaseous ammonia. It was thus a preferred object of the present invention to specify a means of providing protection of components over a long period and/or over a wide temperature range against liquid ammonia or liquid ammoniacal media and gaseous ammonia. Halogenated materials were also to be avoided as far as possible.

The stated object is achieved by the use of a carbon-like coating for protection of a passive electrical component from attack by ammonia, wherein the carbonaceous coating (i) is a sol-gel coating or (ii) is a plasma-polymeric coating and in each case comprises a carbon content, measured at a depth of 80 nm away from the side of the coating remote from the component, of 50 to 100 atom %, preferably 50 to 90 atom %, or, as an organometallic coating, comprises a carbon content of 2 to 50 atom %, in each case measured by XPS and based on the atoms detected by XPS.

Where the present text refers to "ammonia", this is understood to mean—unless specified otherwise—pure ammonia and dilute ammonia ("ammoniacal media"). It should be taken into account here that "ammonia" may be either in liquid or gaseous form. In the context of the invention, it is preferable in the case of doubt, where "ammonia" is mentioned, that this is gaseous ammonia. It should be taken into account here that liquid ammonia or liquid ammoniacal media have distinctly different chemical characteristics than gaseous ammonia. Liquid ammonia, especially in combination with aqueous media, behaves as an alkali; this is not the case for gaseous ammonia.

A "sol-gel coating" in the context of this text is a layer which is producible or has preferably been produced by a sol-gel method.

Some of the coatings for use in accordance with the invention are organometallic coatings. Organometallic coatings in the context of this application comprise a proportion of metals of ≥10 atom %, measured by XPS and based on the atoms detected by XPS. In the context of the present invention, silicon is explicitly included by definition among the metals.

The coatings for use in accordance with the invention either have a carbon content of 50 atom % and in that case comprise 10 atom % of metals including silicon or they are organometallic layers in the sense of the above definition.

Preferred organometallic layers comprise 10 to 40 atom % of silicon.

As an alternative to sol-gel coatings, according to the invention, plasma-polymeric coatings are even usable with preference.

The generation of plasma-polymeric coatings or plasma polymerization per se are known to those skilled in the art. Plasma polymerization is a specific plasma-assisted variant of chemical vapor deposition (PE-CVD). In plasma polymerization, vaporous organic precursor compounds (precursor monomers) in the process chamber are first activated by a plasma. The activation gives rise to ionized molecules, excited states or free radicals, and molecular fragments of the precursors are formed to some degree in the gas phase. The subsequent condensation of these fragments on the substrate surface, under the action of substrate temperature and electron and ion bombardment, brings about the polymerization and hence the formation of a continuous layer. The structure of the resultant plasma polymers is highly cross-linked, and they form a largely statistical covalent network. The deposition of catenated polymers in mono- or polycrystalline form is therefore not possible by plasma polymerization. Under PE-CVD conditions, the precursors used are converted to reactive species only by the excitation in the plasma process. The person skilled in the art therefore distinguishes plasma polymerization from other deposition methods, for example atomic layer deposition (ALD methods). The ALD method is a significantly modified CVD method by means of two or more cyclically conducted self-limiting surface reactions, as a result of which the layers generally adopt a polycrystalline or amorphous structure. Plasma polymerization, used with preference in accordance with the invention, is a specific plasma-activated variant of chemical vapor deposition (PE-CVD).

A passive electrical component in the context of this invention is preferably a coil, a capacitor, a resistor and/or contains windings. More particularly, the passive electrical component is a coil. Preferably, the passive electrical component is a power component, i.e. a component that converts one form of energy to another, for example a transformer.

Analogously to use in a transformer, further possible fields of use are conceivable for passive electrical components, especially coils, for example in motors or generators or as an inductance coil.

It has been found that, surprisingly, the layers for use in accordance with the invention can give excellent improvement with respect to attack by ammonia. This is especially also applicable in the specific situation of a cooling system in which ammonia or ammoniacal media are used as coolant and come into contact with the electrical component protected by the coating for use in accordance with the invention. In the case of this contact, it is generally the case that considerable temperature differences (according to the situation of the cooling process) arise. Thus, there are considerable demands on the coating (and possibly also underlying coatings; see below).

The preferred plasma-polymeric coating for use in accordance with the invention is described in detail in German patent application 10 2016 214 493.6. By way of reference, the text passages that characterize the plasma-polymeric layer in detail from the latter application are incorporated into the present application.

The carbonaceous coatings to be used in accordance with the invention may also be configured as aCH coatings (amorphous carbon coating) or else optionally as DLC (diamond-like carbon coating). Preference is given here to the aCH coatings.

It is preferable that the carbon content in the coatings for use in accordance with the invention, in the case of organometallic coatings, is from 5 to 50 atom %, further preferably from 10 to 45 atom %, in each case measured by XPS and based on the atoms detected by XPS.

In principle, atom % figures—unless stated otherwise—are always based on the total number of atoms detected by XPS.

XPS or ESCA is a standard test method for determination of proportions of matter.

Preference is given to a use of the invention wherein the carbonaceous coating, measured at the surface of the side of the coating remote from the component, based on the total carbon content, measured by XPS at this surface, comprises (i) ≤15 atom %, preferably ≤11 atom %, for sol-gel coatings or (ii) ≤10 atom %, preferably ≤5 atom %, for plasma-polymeric coatings of carbon as constituent of hydrolyzable groups.

It has thus been found that it is possible to deposit the coatings to be used in accordance with the invention in the plasma-polymeric process or in the sol-gel process in such a way that the proportion of hydrolyzable groups on the surface is very small. It is apparently the case that these groups make the protective layers particularly prone to attack on contact with ammonia.

Hydrolyzable groups in the context of this invention are preferably those groups selected from the group consisting of ester, amide, urethane and urea groups.

The proportion of carbon in such groups can be determined by finding the chemical shift, especially in the range from 288.5 to 290.5 eV, on the surface of the coating, with C1s peak fitting. In this regard, reference is also made to the description further down and especially the corresponding example.

Preference is given to a use of the invention wherein the carbonaceous coating is an aCH coating or an organosilicon coating.

The organosilicon coating preferably comprises 10 to 40 atom % of silicon, preferably 20 to 32 atom % of silicon, and/or 30 to 70 atom % of oxygen, preferably 40 to 64 atom % of oxygen, based in each case on the total number of carbon, silicon and oxygen atoms present in the coating.

Accordingly, preference is given to a use of the invention wherein the carbonaceous coating comprises silicon and/or has elongation at break of ≤2.5% and/or a hardness measurable by means of nanoindentation in the range from 2 to 6 GPa, preferably 3.1 to 6 GPa, and/or comprises proportions determinable by measurement by XPS, measured at a depth of 80 nm away from the side of the plasma-polymeric coating remote from the interlayer, 5 to 40 atom %, preferably 20 to 32 atom %, of silicon and/or 30 to 70 atom %, preferably 40 to 64 atom %, of oxygen, based on the total number of carbon, silicon and oxygen atoms present in the coating, and/or has a thickness of 100 nm to 100 µm, preferably 200 nm to 50 µm and further preferably 500 nm to 10 µm.

It is preferable that the plasma polymeric coating for use in accordance with the invention has an average layer thickness of 100 nm to 100 µm, preferably 200 mm to 50 µm and further preferably 500 nm to 10 µm.

It is preferable to deposit the plasma-polymeric layer in such a way that a bias voltage develops on the substrate. The best way of doing this is by connecting the substrate to be coated as cathode. This results in ion bombardment of the resultant coating, such that—without being bound to a theory—layers having a good combination of the properties of hardness and flexibility are formed, expressed by elongation at break of 2.5%, preferably 3% (elongation until break).

Such a flexibility is especially important for passive electrical components which, after they have been coated, have to be formed once more, as may be the case, for example, for coils after the coating process, or are exposed to thermal stresses.

Particularly good layer properties are achieved in the case of establishment of bias voltages of 50 to 300 volts, preferably 100 to 200 volts, during the deposition process relative to ground (of the plasma generator).

It is preferable that the plasma-polymeric coating has a hardness measurable by means of nanoindentation in the range from 1.5 to 6 GPa, preferably 2.4 to 5 GPa, further preferably 3.1 to 4 GPa.

This nanoindentation hardness is more preferably in combination of an elongation at break of 2.5% and further preferably in a combination with an elongation at break of 3.0%. Thus, layers having a particularly good combination of hardness and flexibility are provided on the passive electrical component.

If the carbonaceous coating to be used in accordance with the invention is a sol-gel coating, preference is given to systems such as, for example, Clearcoat U Sil 120 GL (NTC-Nano Technology Coating GmbH).

The preferred sol-gel layers to be used in accordance with the invention include the constituents of carbon, oxygen and silicon mentioned for the plasma-polymeric layers in the same way. The preferences here are configured exactly as for the plasma-polymeric layers.

One example of a suitable sol-gel coating (produced with the above-described sol-gel system) comprises 7.6 atom % of silicon, 32.2 atom % of oxygen, 56.6 atom % of carbon and 3.6 atom % of nitrogen, each measured by means of XPS (peak position of the Si2p peak: 102.8 eV).

It should generally be noted that some passages in this text refer to the carbon content of the carbonaceous layer measured at a depth of 80 nm away from the surface. The reason for this is that surface effects, for example saturation with oxygen, are to be eliminated. The measurement here is preferably effected as described in measurement example 1. Where hydrolyzable groups on the surface are concerned, measurement is made directly at the surface, since it is the surface effects that are of primary importance here.

Preference is given to a use of the invention wherein an interlayer is disposed between the electrical component and the carbon-like coating.

By means of an interlayer, it is possible to improve the particularly favorable properties of the carbonaceous coating to be used in accordance with the invention once again.

It is preferable that the interlayer has a lower coefficient of thermal expansion than the carbonaceous coating. It is thus possible that the carbonaceous coating advantageously interacts with the interlayer.

Preference is given to a use according to the invention wherein the interlayer is selected from the group of the DLC layers and ceramic layers, these preferably based on $TiO_2$, $SiO_2$, $Al_2O_3$, $Ti_xN_y$, or BN, further preferably an eloxal layer.

Eloxal layers and ceramic layers are typical insulation layers that are used in the prior art, or protective layers. They have a comparatively low coefficient of thermal expansion, and so they frequently lose their protective action under thermal and mechanical stress in the combination with metals beneath. In the case of this type of layers, this effect can surprisingly be compensated for or alleviated in a particularly efficient manner by means of the carbonaceous coating for use in accordance with the invention.

A particularly preferred interlayer in the context of the present invention is an eloxal layer, especially in the case of an aluminum surface of the passive electrical component that has been coated therewith. Preferred layer thicknesses of the interlayer are 0.2 to 30 µm, further preferably 1 to 20 µm and particularly 2 to 10 µm.

In addition, it may be preferable in many cases, especially in the case of an interlayer of eloxal, for the interlayer to be executed in such a way that only closed pores are present in the SEM section at least in the upper region of the eloxal layer with respect to the carbonaceous coating. It may further preferably be the case that a semicrystalline state exists in the surface region of the eloxal layer. In the case of the eloxal layer, this embodiment can be achieved, for example, by recompression in hot water.

Preference is given to a use of the invention wherein at least the surface of the component consists of copper, aluminum or an alloy comprising copper and/or aluminum. It is preferable that the whole component consists of these materials. More particularly, in this connection, preference is given to aluminum.

It is further preferable in accordance with the invention that the component is a coil, a resistor or a capacitor.

Preference is given to a use of the invention wherein the interlayer contains a crosslinked and/or uncrosslinked oil and/or crosslinked and/or uncrosslinked silicone oil, and/or a zone of crosslinked oil and/or crosslinked silicone oil is present between the interlayer and the carbonaceous coating.

An oil is understood by the person skilled in the art to mean a collective term, derived from the Latin word "oleum", for water-insoluble organic compounds that are liquid at 20° C. and have relatively low vapor pressure, the common feature of which is not matching chemical constitution but similar physical consistency. Oils have a relatively high viscosity; they are soluble in nearly all organic solvents. They may be natural, vegetable or animal oils, optionally modified vegetable or animal oils, mineral oils (obtained from crude oil), and fully synthetic oils, for example silicone oils. The non-silicone oils especially include halogen-free organic liquids selected from the group consisting of hydrocarbons, fatty acids, triglycerides, mineral oils and polyethers.

A silicone oil is understood by the person skilled in the art to mean those synthetic oils in which silicon atoms are joined in a catenated or network-like manner via oxygen atoms and the remaining valences of the silicon are satisfied by hydrocarbon radicals, usually methyl groups, and less commonly by ethyl groups, propyl groups, phenyl groups inter alia.

Alternatively, the remaining valences may also be partly or fully satisfied by hydrohalocarbon groups, especially hydrofluorocarbon groups, where all hydrogens present are optionally replaced by halogen, especially fluorine atoms. Preferably, corresponding silicone oils have a molecular weight of >600 g/mol.

A crosslinked oil or a crosslinked silicone oil is capable of stabilizing the bond between plasma-polymeric layer and interlayer and, for example, of compensating for unevenness on the interlayer or filling pores in the interlayer. The crosslinking is preferably effected preferably in the course of the plasma polymerization process, which can be adjusted in such a way that crosslinking conditions exist prior to the layer deposition. The regions referred to as uncrosslinked, in the context of the invention, always also have a low level of crosslinked constituents, which effectively equates to partial crosslinking. Furthermore, the oils or silicone oils tend to be more crosslinked on the open side of the pores of the eloxal layer and, by virtue of the degree of crosslinking present there, also give good adhesion to the eloxal material. On the opposite side (closed pore side toward the substrate material), the degree of crosslinking tends to be lower and may also be present in the above-described form of the uncrosslinked oil. As an alternative or in addition to pore filling, compaction of the interlayer is also possible, for example hot compaction at 90 to 100 degrees Celsius in deionized water for one hour.

It is preferable—if pores are still present in the interlayer—that these have a size of 1 to 200 nm, preferably 1 to 100 nm and further preferably 1 to 30 nm, based in each case on the greatest pore diameter viewed at right angles to the surface of the interlayer, measured with a scanning electron microscope.

In many cases, however, it is preferable that the pores of the interlayer are filled. A suitable example for this purpose is heat-crosslinking silicone. Most preferably a material named "HTA" (manufacturer: AZ Elektronics Materials GmbH, Wiesbaden). As an alternative or in addition to pore filling, compaction of the interlayer is also possible, for example hot compaction at 90 to 100 degrees Celsius for one hour.

Preference is given to a use of the invention with an interlayer, wherein the carbonaceous, especially plasma-polymeric, coating has a variance of −60% to +1000%, preferably −50% to +500%, further preferably −55% to +250%, based on the average layer thickness in individual regions of the layer.

It is possible by virtue of the coating process that, for example in the coating of an aluminum coil provided with an eloxal interlayer, the coating process is conducted in such a way that a particularly low layer thickness of the plasma-polymeric layer is present in the middle of the coil, while the average layer thickness is present on the outside, while an elevated layer thickness exists on the inside. The inside is the side of the coil facing the tooth of the motor or laminated stack. The outside is correspondingly the remote side, and the middle the position in between.

Preference is given to a use of the invention wherein the interlayer and the carbonaceous coating together have a dielectric strength measured to DIN EN 60243-1 and DIN EN 60243-2 of 100 V measured for a current up to a maximum of 3 mA.

Dielectric strength is an important parameter for passive electrical components, especially for coils, capacitors and resistors. It has been found here that dielectric strength increases with decreasing roughness of the with the coated surface with otherwise identical parameters (layer thickness, deposition conditions, etc.).

It was also found to be preferable that, when the above-identified roughness values of the substrate are exceeded ($r_a$ greater than 0.5 μm), the layer thickness of the carbonaceous coating is correspondingly increased by a factor between 2 and 10 in order to be able to achieve the same electrical insulation properties and values.

Preference is given to the use of the invention with an interlayer, wherein the component, after being exposed to dry air in an air circulation oven at 300° C. for 500 hours, followed by cooling to 20° C. within one hour, has at least 80% of the dielectric strength prior to the treatment.

In the coating system for use in accordance with the invention on the passive electrical component, it is possible to achieve surprisingly good and sustained values for dielectric strength. Dielectric strength is preferably determined as described in measurement example 2. Dielectric strength additionally also seems to be an indicator for good resistance to ammonia.

Also part of the invention is a system intended for contact with ammonia or ammoniacal media, comprising a passive electrical component having a carbonaceous coating as defined above, preferably in one of the preferred configurations, and optionally with an interlayer, likewise as defined above, likewise preferably as in a preferred embodiment, disposed in a region of the system intended for direct contact with ammonia or ammoniacal media.

This is because it is possible, owing to the coating for use in accordance with the invention, to achieve excellent protection of the corresponding components against exposure to ammonia, including those associated with fluctuating temperatures.

Preferably, the system of the invention is a cooling apparatus or a plant for production, for processing, for use, for transport or for storage of ammonia or ammoniacal media.

As already described above, preference is given to a plasma-polymeric carbonaceous coating for the use of the invention. This coating can in principle be produced from organometallic, especially organosilicon, precursors, especially HMDSO (this is especially true of organometallic coatings), or from purely organic precursors such as acetylene in particular. The person skilled in the art here is capable, by means of a suitable process regime, of establishing the preferred carbonaceous plasma-polymeric coatings for use in accordance with the invention.

EXAMPLES

Measurement Examples

Measurement Example 1

XPS Measurement Procedure at Layer Depth 80 nm

A surface analysis by means of photoelectron spectroscopy (XPS) covered about the outermost 10 nm of a solid-state surface. In order to be able to analyze the chemical composition of the sample material at a depth of 80 nm by XPS, the surface is removed by ion beam bombardment. For this atomization process, argon ions having an energy of 3 keV are typically used. The time required to remove the uppermost 80 nm of a sample surface depends on the instrument-specific atomization rate. This is determined experimentally in each case by comparative measurements on corresponding reference samples. The typical pressure range for such sputtering processes is in the range from $1*10^{-5}$ to $1*10^{-6}$ mbar.

Measurement Example 2

Testing of Electrical Insulation Properties:
Partial Discharge Measurement Technique:
→Nondestructive test method for determination of the electrical insulation effect of coatings (by way of example for the DWX-05 instrument, preferably on coil geometries or electric motors)

Technique:

The instrument used (DWX-05) is essentially a high-voltage source capable of generating a high-voltage pulse within a very short time (shorter than 1 msec—with a very large flank), or of "imprinting" it into the component. The component to be examined (preferably a coil or an engine part) is connected firstly to the voltage source and secondly to the measurement electronics. In addition, an RF antenna (including band filter) is connected to the instrument, which measures the occurrence of RF discharges (correlated to time) with the voltage pulse imprinted. It is important here that the antenna and the coil do not touch one another. The measurement is then effected from a preset voltage and is continually increased by a particular value (typically 5% of the last voltage tested) until TE discharge is detected or the required final voltage is attained. The measurement used is firstly the response of the system (the coil) itself (case A) and secondly the detection of RF discharges (case B) which are characteristic and are observed just before the occurrence of a flashover between two windings or to the tooth. The measurements are conducted at least three times for each voltage value and the final values are used to ascertain an average in order to obtain a statistically certain result. In the case of large variations in the final measurements, the sample should possibly be checked for homogeneity, or the measurement ascertained should be used only with restrictions.

The variances allowed beforehand in the measurement signals from the target state thus effectively form the test criteria. Maximum possible voltage values in the present instrument are 5 kV.

For this test method, the measurement signals are analyzed in two ways (optionally also both criteria simultaneously):
1. Comparing with a reference signal (recorded on an undamaged component or in a lower voltage range in which the insulation is definitely intact—assessment with reference to the curve profile)—deviations of more than +20% or −4% of the response signal detected from the scaled curve of the reference signal are regarded as "defective" insulation for the voltage value being tested in each case or a collapse in the response signal (resulting from a short circuit)
Collectively case (A)
2. Measuring the RF discharge and comparing with the "base noise" of the RF signal—in the event of deviations or the occurrence of clear RF signals (correlated in time with the voltage profile of the signal imprinted), a partial discharge is detected and hence the coating is determined as being inadequate over and above this voltage value—it is additionally advisable to use the LaPlace 15/0 criterion in the automated evaluation.
→ Collectively case (B)
Sample Requirements:
Geometry in the form of a coil (metal substrate)

Minimum inductivity requirement—currently at least 10 windings, instrument-specific value Full-area coating in constant quality of a component or of the individual components with respect to one another in a "batch check"

Accessibility of the contacting and of the tooth (in the installed state) or regions on tooth and coil that can be contacted without coating.

Mass production-capable testing for 100% of the components is possible by this test method Further information on this test method can be found in: Ein neues Verfahren zur automatischen Gewinnung der Teilentladungseinsetz- und Aussetzspannung an elektrischen Wicklungen nach IEC TS 60034-18-41 und IEC TS 61934 [A New Method of Automatically Obtaining the Partial Discharge Inception and Extinction Voltage of Electrical Windings According to IEC TS 60034-18-41 and IEC TS 61934]—from conference: Internationaler ETG-Kongress 2009—Symposium 3: Direktantriebe in Produktionsmaschinen und Industrieanlagen—Generatoren und Antriebe in regenerativen Kraftwerken [Direct Drives in Production Machines and Industrial Plants—Generators and Drives in Renewable Power Plants]/Symposium 4: Diagnostik elektrischer Betriebsmittel [Diagnostics of Electrical Equipment] Oct. 27, 2009-Oct. 28, 2009 at Düsseldorf, Germany.

Measurement Example 3

Stress Test for Dielectric Strength
Coils/samples were produced as in working example 1. An oven was heated to 300° C. and the coils were placed therein and stored therein for 500 h. After the aging, the samples were removed and cooled to room temperature within one hour. Thereafter, the samples were tested according to measurement example 2. A maximum drop in the dielectric strength by 15% was observed by comparison with the starting state prior to the aging.

Measurement Example 4

Nanoindentation Measurement
Nanoindentation is a testing technique by which the hardness of surface coatings can be ascertained by means of a fine diamond tip (triangular pyramids [geometry according to Berkovich], radius a few hundred nm). In this case, by contrast with the macroscopic determination of hardness (for example Vickers hardness), the measurement is not made on the remaining indentation trough that has been made by a normal force, and instead a penetration depth-dependent cross-sectional area of the nanoindenter has been assumed. This depth-dependent cross-sectional area is ascertained via a reference sample with known hardness (generally high-purity quartz glass).

During the application of the normal force, nanoindentation uses sensitive steering electronics (capacitative plates) by which the penetration depth can be measured precisely as the normal force rises and falls again—quite differently to the conventional method.

During the initial phase of load removal in situ, the standard force penetration depth curve indicates the stiffness of the sample. With the aid of the cross-sectional area of the nanoindenter which is known from the reference sample, the modulus of elasticity and hardness of the sample can thus be determined. The maximum testing force for the nanoindentation is generally below 15 mN.

For measurement of the pure properties of the coating without any influence by the substrate, a rule of thumb of 10% of the layer thickness is used. Penetration curves that go below that include an influence by the substrate used. With rising penetration depths of more than 10% of the layer thickness, the measured values for modulus of elasticity and hardness successively approach those of the substrate. The described evaluation by this test method is named for Oliver & Pharr [Oliver].

For simpler variation of the penetration depths at different loads, what is called the multiple loading and load relief method, the multiindentation method for short, is used. In this case, loads are applied and relieved on a fixed point in segments. The local load maxima are increased continuously. At the fixed point, it is thus possible to ascertain depth-dependent values of modulus of elasticity and hardness. In addition, for statistical purposes, various unaffected sites on the sample are likewise approached and tested in a measurement field. By comparison between single indentation and multiindentation methods, Schiffmann & Küster showed that there are only very small deviations between the values ascertained in the two methods [Schiffmann] For compensation, longer hold times are suggested for prevention of creep effects of the piezo scanner [Schiffmann].

In the case of the measured samples of the working examples described in the text, measurement was made with 10 multiindentations per site with preferably a maximum of 5 mN, further preferably less than 2 mN, even further preferably less than 1 mN. The multiindentations have local force maxima that have then been reduced to 20% of the force. These load relief curves were evaluated in the form of a tangent from 98% to 40%.

For statistics and homogeneity, 10 measurement points per sample were tested. The distance between the measurement points was 50 μm in order to avoid effects such as plastic deformations of the layer to be examined as a result of prior measurements, for example.

The layer thicknesses of the samples that were used to determine the layer hardnesses were more than 1 μm in each case. To comply with the empirical formula for the penetration depth of max. 10% of the layer thickness, the load relief curves for the multi-indentations are admissible for the evaluation up to a maximum force of not more than 5 mN, further preferably less than 2 mN, even further preferably less than 1 mN. In the case of lower layer thicknesses, the corresponding maximum local force should be noted in order not to exceed the 10% rule.

The maximum force for the penetration depth and the corresponding load relief curve is thus preferably not more than 5 mN, further preferably less than 2 mN; depending on the layer thickness of about 1000 nm it is even further preferably less than 1 mN.

Working Examples

Working Example 1

Low-Pressure Plasma Coating Process

The deposited plasma polymer layers based on an inorganic matrix structure (preferably silicon-based) have a comparatively high organic character which, by comparison with SiOx layers, results in a higher crack onset strain. The plasma layers are preferably deposited under reduced pressure at about $10^{-2}$ mbar with the aid of a high-frequency plasma discharge (PE-CVD). In this case, a silicon-containing working gas is fragmented. The resultant fragments precipitate on the substrate as a thin layer. In order to increase the density of the layer, an ion-assisted method is employed, meaning that the partly ionized fragments are fired into the growing layer under the influence of an electrical field. The use of this technology ensures the applicability of the coating to complex coil geometry.

Low-Pressure Plasma Coating Process

The plasma coating is conducted under reduced pressure with a reactor of size 360 L at about $10^{-2}$ mbar. An aluminum coil with 14 windings is extended to a length of 18 cm and placed onto two coupled sheets (200 mm×25 mm×1 mm). These sheets lie on an insulator plate (0.2 mm) which in turn lies on the actual plasma electrode. This construction prevents arcing that occurs during the plasma coating. The capacity of the coupled sheets is about 68 pF in each case. The frequency of the high frequency used of 13.56 MHz results in a resistance per coupled sheet of 171 ohms.

At the start of the coating process, plasma activation with oxygen is conducted for 3 minutes. This step leads to an improvement in layer adhesion.

In the second step, a primer layer is deposited. For this purpose, for oxygen, a flow rate of 5 sccm of hexamethyldisiloxane (HMDSO) is admitted into the reactor. The process time is 1 minute. The actual deposition process of the insulation coating is conducted at a HMDSO flow rate of 20 sccm. The process time is 2 hours. In order to hydrophilize the surface of the coated coil, it is subsequently possible to conduct a further plasma activation with oxygen. The plasma power and oxygen flow rate in all process steps are constant and are 45 W and 60 sccm respectively.

The resulting layer had a composition (measured according to measurement example 1) of C: 32 atom %, O: 46 atom %, Si: 22 atom %.

The nanoindentation hardness measured according to measurement example 4 was: 1.8 GPa±0.2 GPa The coated coil was locally characterized with regard to layer thickness and insulating effect (dielectric strength measured to DIN EN 60243-1 and DIN EN 60243-2). This resulted in the following values:

TABLE 1

| Area of winding (layer thickness about 4.5 μm) | Outer edge (layer thickness about 7.0 μm) | Inner edge (layer thickness about 11 μm) |
| --- | --- | --- |
| 470 V | 610 V | 640 V |
| 470 V | 540 V | 720 V |
| 450 V | 620 V | 670 V |
| Ø 463.3 V | Ø 590.0 V | Ø 676.7 V |

Alternatively, the coating process by means of plasma can also be assisted by the application of what is called a BIAS voltage. Advantages here are the possibility of increasing the layer deposition rate and the possibility of generating a denser plasma polymer matrix.

Working Example 2

Treatment Process of Anodization+LP Plasma Coating

Al sheets/Al coils are wet-chemically cleaned, pickled and anodized in a sulfuric acid-based electrolyte for 5 to 60 minutes. The subsequent treatment of a hot compaction at 90° C. to 100° C. for 10 to 60 minutes is optional. The anodization layers thus produced on the aluminum coils have a layer thickness of 1 μm to 25 μm. Subsequent coating treatment by the scheme of working example 1.

Working Example 3

Treatment Process of Anodization+Filling of the Pores of the Anodization Layer+LP Plasma Coating Al sheets are wet-chemically cleaned, pickled and anodized in a sulfuric acid-based electrolyte for 10 to 60 minutes. No hot compaction takes place. The sheets are subsequently aged in a US bath with HTA oil (5, 15, 30 min). There is a final heat treatment for crosslinking of the oil (7 d at RT or 30 min at 100° C.). Subsequent coating treatment by the scheme of working example 1.

As a result, it is possible to increase dielectric strength by up to 20% compared to working example 2.

Working Example 4

Aging of Coated Specimen Sheets in Ammonia Gas Atmosphere:

The specimen sheets made of Al 99.5 that were coated in the experiments described above were installed into the pipe system in a cooling circuit at various angles of impact of the cooling gas. The coating consisted here either of a combination of eloxal (from working example 2) with a plasma polymer layer arranged thereon or of a plasma polymer layer (from working example 1) alone.

As a comparison, the following were applied to the substrate from working examples 1 and 2:

a) epoxy-based powder coating (3M Scotchcast 5555) according to manufacturer's description, b) an epoxy-isocyanate-based aircraft paint (Aerodur® Barrier Primer 37045, Akzo Nobel), likewise according to manufacturer's instructions, c) a fluoropolymer-based overcoat (Intersleek 1100SR from International Akzo Nobel) according to manufacturer's instructions, and d) a sol-gel coating to be used in accordance with the invention (Clearcoat U—Sil 120 GL, NTC-Nano Technology Coating GmbH), likewise according to manufacturer's instructions. The composition of the sol-gel layer according to measurement example 1 was determined as Si=7.6 atom %, o 0 32.2 atom %, C=56.6 atom % and N=3.6 atom %.

The results are recorded in table 2.

case three cycles of the typical working cycle in such a cooling system per day were run in the test arrangement. Cooling at −40° C. followed by thawing of the system at +80° C. in the ammonia (gas) atmosphere in alternation.

In the studies, it was found that systems such as a powder coating that are characterized as stable were also found to be unstable under the conditions tested. Even the aircraft paint, which is approved for at least some of the temperature ranges in question, does not have sufficient durability. Both systems showed a virtually complete loss of adhesion after the test period. The overcoat used, as a fluoropolymer system, was found to be stable. However, in order to achieve comparable insulation effects to those possessed by the layers to be used in accordance with the invention, a distinctly greater layer thickness was necessary here (particularly by virtue of the application). This is disadvantageous especially in the field of coil applications since an important factor here is packing of maximum density for the component (fill factor). Furthermore, the PTFE constituents in fluoropolymers are generally stable to temperatures of briefly about 300° C.—thereafter, the systems (PTFE) begin to break down (possibly with formation of HF fractions) and hence lose their effect. In a cooling circuit, it is rare for such temperatures to be attained in the gas stream, but this is possible at the surface, for example, of a coil in use—and any weak point, no matter how small, can thus lead to failure of the component as soon as the insulating effect is lost. Furthermore, the organic constituents of such paint systems break down even at typically relatively low temperatures of above 200° C., which likewise results in degradation of the insulation properties.

The coatings for use in accordance with the invention did not show any impairment at all as a result of the exposure. They have such good values that they are also of good suitability for replacing PTFE-containing layers in order to avoid their disadvantages.

In addition, the conditions at the test site examined in the paint system were much harder than they would be for a compressor motor in a standard system.

TABLE 2

Results of the aging of coated specimen sheets in ammonia gas atmosphere

| Coating | Ref. | System | Layer thickness | Test (14 d) | Adhesion result | Insulation after test [V] | Theor. insulation [kV/mm] |
|---|---|---|---|---|---|---|---|
| Powder coating | (old) | Epoxy | ~50 μm | x | x | | up to 50 |
| Aircraft paint | Paint | Epoxy-isocyanate | 100-130 μm | x | x | | |
| Overcoat | ✓ | Fluoropolym. | 80-100 μm | ✓ | ✓ | >4000 | 40 |
| Sol-gel | Glass | Polysiloxane-urethane resin | ~15-20 μm | ✓ | ✓ | 530 ± 145 (675 ± 430) | ~25 |
| Plasma | Plasma | $Si_xO_yC_z$ | <5 μm | ✓ | ✓ | 200 ± 40 | PP~55 |
| Eloxal + plasma | Ceramic | $Al_2O_3$ + $Si_xO_yC_z$ | ~3 + 5 μm | ✓ | ✓ | 350 ± 110 | Eloxal~50 PP~55 |

In table 2, "X" indicates failure of the coating.

The installation state was parallel (parallel to the flow direction of the gas), at a 90° angle (perpendicular to flow direction) and at a 45° angle to the flow direction of the gas—in each case viewed from the sample normal. The flow rate of the ammonia gas here had typical values for such systems, here between 0.5 and 40 m/sec depending on the operation cycle.

The samples were installed here in the normal part of an ammonia-driven cooling circuit. For this purpose, in each The mass and volume flow rates and temperatures and states of the ammonia are extremely different at the test site. A compressor motor is constantly subjected to a uniform temperature and to a vaporous or "gaseous" state of the coolant. For example, for a cold room at room temperature 2° C., the suction gas temperature in the compressor is fairly constant at −10° C. Liquid coolant or higher temperatures are not to be expected or to be strictly avoided.

Of course, they would be smaller variations when the system is switched on and off, or after defrosting phases.

However, the expansion valve of a refrigeration system exerts such rapid control that the actual suction gas temperature is adjusted within seconds. The compressor motor is cooled constantly with the suction gas volume flow.

It can be concluded from this that the coatings for use in accordance with the invention have reserves of resistance for customary use. Against the background of this working example, it is preferable that the effects improved in accordance with the invention, in the case of doubt, occur under the conditions of the test experiment conducted in this example, i.e. more particularly under the conditions of a cycle from 80° C. to −40° C. three times per day in a direct gas stream at gas velocities of up to 40 m/s.

Working Example 5

Determination of the Proportion of Hydrolyzable Groups on the Carbon

1. The determination procedure was analogous to the following literature reference:

"Practical Surface Analysis"—Second Edition 1990, Volume 1 "Auger and X-ray Photoelectron Spectroscopy", edited originally by D. Briggs and M. P. Seah, John Wiley & Sons, e.g. ISBN 0-471-92081-9—the following chapter therein: Appendix 3: Data Analysis in XPS and AES, A 3.7 The analysis of overlapping spectral features A 3.7.9 Curve synthesis and curve fitting, page 572 ff.

In a departure from the procedure described, the area proportions were taken into account by a peak in the fit of the C—N components (if applicable by virtue of an N content in the coating) and the (C═O)—N or (C═O)—O components (hydrolyzable components). (kept the same relative to one another—1:1)

2. Results

By the method described above, the plasma-polymeric coating from working example 1, the sol-gel coating from working example 4 and an aCH layer produced in a plasma-polymeric coating process were evaluated. This evaluation is illustrated in detail using the example of the sol-gel layer:

According to the XPS measurement, at the surface of the sol-gel layer to be used in accordance with the invention, a concentration of 32.2 atom % of O, 3.6 atom % of N, 56.6 atom % of C and 7.6 atom % of Si is found. A fit or deconvolution (resolution) of the various species was conducted on the basis of the C1s peak (cf. FIG. 1). The peaks resolved are as follows:

TABLE 3

Component peaks after deconvolution of the C1s peak

| Name | Pos. | FWHM | % area |
|---|---|---|---|
| C—C | 285.0 | 1200 | 55.5 |
| C—O | 286.7 | 1200 | 19.4 |
| (C═O)—N or (C═O)—O (hydrolyzable components) | 289.4 | 1400 | 11.0 |
| C═O | 287.8 | 1189 | 3.1 |
| C—N | 285.8 | 1190 | 11.0 |

The proportion of hydrolyzable constituents is referred to as (C═O)—N or (C═O)—O (see also FIG. 1).

This shows that 11 atom % of the carbon atoms were present as a constituent of hydrolyzable groups for the sol-gel layer. Analogous measurements for the plasma-polymeric coating from working example 1 showed that 1.5 atom % of the carbon atoms are present in corresponding groups, whereas, for the plasma-polymeric aCH layer that was examined as the third example, 3 atom % of the carbon atoms were present in hydrolyzable groups.

Without being bound to a theory, it seems to be the case that the layers having the carbon components present at the surface, owing to the small proportions of groups attackable by ammonia at the surface—but also by virtue of the backbone network present deeper into the coating—do not undergo any destruction and have good stability to ammoniacal media. In the case of the sol-gel coatings, even in the case of somewhat higher proportions of carbon in attackable groups at the surface, there appears to be sufficient resistance to ammoniacal media, as apparent from working example 4.

The invention claimed is:

1. A carbonaceous coating for a passive electrical component for protecting the passive electrical component from an attack by ammonia comprising:
   (i) a sol-gel layer which is producible or has been produced by a sol-gel method or
   (ii) a plasma-polymeric layer which is producible or has been produced by plasma-activated chemical vapor deposition;
   wherein each of (i) the sol-gel layer or (ii) the plasma polymeric layer has a surface facing away from the passive electrical component, and
   comprises a carbon content of 50 to 90 atom % at a depth of 80 nm below the surface and as measured by and based on a total number of atoms detected by XPS, or
   comprises an organometallic layer comprising a carbon content of 2 to 50 atom % at a depth of 80 nm below the surface and as measured by and based on the total number of atoms detected by XPS; wherein
   each of (i) the sol-gel layer or (ii) the plasma polymeric layer has at least one hydrolyzable group on the surface, the at least one hydrolyzable group being selected from the group consisting of ester, amide, urethane and urea groups, and
   (i) the sol-gel layer comprises a hydrolyzable carbon content of ≤15 atom % or (ii) the plasma-polymeric layer comprises a hydrolyzable carbon content of ≤10 atom %, wherein hydrolyzable carbon content is the portion of carbon within the at least one hydrolyzable group on the surface relative to the total carbon content on the surface as measured by XPS with C1s peak fitting.

2. The carbonaceous coating of claim 1, wherein the carbonaceous coating is an amorphous carbon coating or an organosilicon coating.

3. The carbonaceous coating of claim 1 further comprising an interlayer disposed between the passive electrical component and (i) the sol-gel layer or (ii) the plasma polymeric layer of the carbonaceous coating.

4. The carbonaceous coating of claim 3, wherein the interlayer comprises a ceramic layer.

5. The carbonaceous coating of claim 1, wherein a surface of the passive electrical component is selected from the group consisting of copper, aluminum, an alloy comprising copper, an alloy comprising aluminum, and a mixture of at least two of the aforementioned.

6. The carbonaceous coating of claim 1, wherein the passive electrical component is selected from the group consisting of a coil, a resistor, and a capacitor.

7. The carbonaceous coating of claim 1, wherein the carbonaceous coating comprises silicon.

8. The carbonaceous coating of claim 1 further comprising an interlayer disposed between the passive electrical component and (i) the sol-gel layer or (ii) the plasma polymeric layer of the carbonaceous coating;
wherein the interlayer is selected from the group consisting of:
an interlayer containing a crosslinked oil; an interlayer containing an uncrosslinked oil; an interlayer containing a crosslinked silicone oil; an interlayer containing an uncrosslinked silicone oil; an interlayer with a zone of crosslinked oil disposed between the interlayer and (i) the sol-gel layer or (ii) the plasma polymeric layer; an interlayer with a zone of crosslinked silicone oil disposed between the interlayer and (i) the sol-gel layer or (ii) the plasma polymeric layer; and a combination of at least two of the afore-mentioned.

9. The carbonaceous coating of claim 4, wherein the ceramic layer is selected from the group consisting of $TiO_2$, $SiO_2$, $Al_2O_3$, $Ti_xN_y$, and BN.

10. The carbonaceous coating of claim 4, wherein the ceramic layer is an eloxal layer.

11. The carbonaceous coating of claim 1, wherein the carbonaceous coating has an elongation at break of ≥2.5%.

12. The carbonaceous coating of claim 1, wherein the carbonaceous coating has a hardness measurable by nanoindentation in a range of 2 GPa to 6 GPa.

13. The carbonaceous coating of claim 1, wherein the carbonaceous coating comprises (ii) the plasma-polymeric layer;
wherein the carbonaceous coating further comprises an interlayer between the passive electrical component and ii) the plasma-polymeric layer;
wherein carbonaceous coating has a silicon content of 5 atom % to 40 atom % based on a total number of carbon, silicon and oxygen atoms as measured by XPS at a depth of 80 nm below the surface.

14. The carbonaceous coating of claim 1, wherein the carbonaceous coating comprises (ii) the plasma-polymeric layer;
wherein the carbonaceous coating further comprises an interlayer between the passive electrical component and ii) the plasma-polymeric layer;
wherein the carbonaceous coating has an oxygen content of 30 atom % to 70 atom % based on a total number of carbon, silicon and oxygen atoms measured by XPS at a depth of 80 nm below the surface.

15. The carbonaceous coating of claim 1, wherein the carbonaceous coating has a thickness in a range of 100 nm to 100 am.

16. The carbonaceous coating of claim 1 further comprising an interlayer between the passive electrical component and (i) the sol-gel layer or (ii) the plasma polymeric layer of the carbonaceous coating; and
wherein the interlayer and (i) the sol-gel layer or (ii) the plasma polymeric layer of the carbonaceous coating together have a dielectric strength measured according to DIN EN 60243-1 and DIN EN 60243-2 of ≥100 V measured up to a maximum current flow of 3 mA.

17. A system for contact with ammonia or ammoniacal media, comprising a passive electrical component having the carbonaceous coating as defined in claim 1 disposed in a region of the system intended for direct contact with ammonia or ammoniacal media.

18. The system as claimed in claim 17, wherein the system is a cooling apparatus or a plant for production, for processing, for use, for transport or for storage of ammonia or ammoniacal media.

19. A carbonaceous coating for a passive electrical component for protecting the passive electrical component from an attack by ammonia comprising:
(i) a sol-gel layer which is producible or has been produced by a sol-gel method or
(ii) a plasma-polymeric layer which is producible or has been produced by plasma-activated chemical vapor deposition;
wherein each of (i) the sol-gel layer or (ii) the plasma polymeric layer has a surface facing away from the passive electrical component, and
comprises a carbon content of 50 to 90 atom % at a depth of 80 nm below the surface and as measured by and based on a total number of atoms detected by XPS, or
comprises an organometallic layer comprising a carbon content of 2 to 50 atom % at a depth of 80 nm below the surface and as measured by and based on the total number of atoms detected by XPS; and
further comprising a ceramic interlayer disposed between the passive electrical component and (i) the sol-gel layer or (ii) the plasma polymeric layer of the carbonaceous coating; wherein the ceramic interlayer is selected from the group consisting of:
a ceramic interlayer containing a crosslinked oil; a ceramic interlayer containing an uncrosslinked oil; a ceramic interlayer containing a crosslinked silicone oil; a ceramic interlayer containing an uncrosslinked silicone oil; a ceramic interlayer with a zone of crosslinked oil disposed between the ceramic interlayer and (i) the sol-gel layer or (ii) the plasma polymeric layer; a ceramic interlayer with a zone of crosslinked silicone oil disposed between the interlayer and (i) the sol-gel layer or (ii) the plasma polymeric layer; and a combination of at least two of the afore-mentioned.

20. The carbonaceous coating of claim 19, wherein:
each of (i) the sol-gel layer or (ii) the plasma polymeric layer has at least one hydrolyzable group on the surface, the at least one hydrolyzable group being selected from the group consisting of ester, amide, urethane and urea groups, and
(i) the sol-gel layer comprises a hydrolyzable carbon content of ≤15 atom % or (ii) the plasma-polymeric layer comprises a hydrolyzable carbon content of ≤10 atom %, wherein hydrolyzable carbon content is the portion of carbon within the at least one hydrolyzable group on the surface relative to the total carbon content on the surface as measured by XPS with C1s peak fitting.

21. The carbonaceous coating of claim 19, wherein the carbonaceous coating is an amorphous carbon coating or an organosilicon coating.

22. The carbonaceous coating of claim 19, wherein a surface of the passive electrical component is selected from the group consisting of copper, aluminum, an alloy comprising copper, an alloy comprising aluminum, and a mixture of at least two of the aforementioned.

23. The carbonaceous coating of claim 19, wherein the passive electrical component is selected from the group consisting of a coil, a resistor, and a capacitor.

24. The carbonaceous coating of claim 19, wherein the carbonaceous coating comprises silicon.

25. A system for contact with ammonia or ammoniacal media, comprising a passive electrical component having the carbonaceous coating as defined in claim 20 disposed in a region of the system intended for direct contact with ammonia or ammoniacal media.

26. The system as claimed in claim 25, wherein the system is a cooling apparatus or a plant for production, for processing, for use, for transport or for storage of ammonia or ammoniacal media.

27. The carbonaceous coating of claim 19, wherein the ceramic interlayer is selected from the group consisting of $TiO_2$, $SiO_2$, $Al_2O_3$, $Ti_xN_y$, and BN.

28. The carbonaceous coating of claim 19, wherein the ceramic interlayer layer is an eloxal layer.

29. The carbonaceous coating of claim 19, wherein the carbonaceous coating has an elongation at break of $\geq 2.5\%$.

30. The carbonaceous coating of claim 19, wherein the carbonaceous coating has a hardness measurable by nanoindentation in a range of 2 GPa to 6 GPa.

31. The carbonaceous coating of claim 19, wherein the carbonaceous coating comprises (ii) the plasma-polymeric layer;

wherein carbonaceous coating has a silicon content of 5 atom % to 40 atom % based on a total number of carbon, silicon and oxygen atoms as measured by XPS at a depth of 80 nm below the surface.

32. The carbonaceous coating of claim 19, wherein the carbonaceous coating comprises (ii) the plasma-polymeric layer;

wherein the carbonaceous coating has an oxygen content of 30 atom % to 70 atom % based on a total number of carbon, silicon and oxygen atoms measured by XPS at a depth of 80 nm below the surface.

33. The carbonaceous coating of claim 19, wherein the carbonaceous coating has a thickness in a range of 100 nm to 100 μm.

34. The carbonaceous coating of claim 19, wherein the ceramic interlayer and (i) the sol-gel layer or (ii) the plasma polymeric layer of the carbonaceous coating together have a dielectric strength measured according to DIN EN 60243-1 and DIN EN 60243-2 of $\geq 100$ V measured up to a maximum current flow of 3 mA.

* * * * *